US012068027B2

(12) United States Patent
Giterman et al.

(10) Patent No.: US 12,068,027 B2
(45) Date of Patent: Aug. 20, 2024

(54) FIN FIELD-EFFECT TRANSISTOR (FinFET) BASED SEMICONDUCTOR MEMORY ARRAY HAVING MEMORY CELLS USING A REDUCED SURFACE AREA

(71) Applicant: ECOLE POLYTECHNIQUE FEDERALE DE LAUSANNE (EPFL), Lausanne (CH)

(72) Inventors: Robert Giterman, Lausanne (CH); Andreas Burg, Echandens (CH); Halil Andac Yigit, Ecublens (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 191 days.

(21) Appl. No.: 17/890,290

(22) Filed: Aug. 18, 2022

(65) Prior Publication Data

US 2024/0062811 A1    Feb. 22, 2024

(51) Int. Cl.
    *G11C 11/41*    (2006.01)
    *G11C 11/412*    (2006.01)
    *G11C 11/419*    (2006.01)
    *H01L 27/088*    (2006.01)
    *H01L 29/78*    (2006.01)
    *H10B 10/00*    (2023.01)

(52) U.S. Cl.
    CPC ......... *G11C 11/419* (2013.01); *G11C 11/412* (2013.01); *H01L 27/0886* (2013.01); *H01L 29/785* (2013.01); *H10B 10/12* (2023.02)

(58) Field of Classification Search
    CPC ..... G11C 11/419; G11C 11/412; G11C 5/025; G11C 8/16; G11C 11/403; H01L 27/0886; H01L 29/785; H01L 27/0207; H10B 10/12; H10B 12/00
    See application file for complete search history.

(56) References Cited

U.S. PATENT DOCUMENTS

| 8,779,528 | B2  |   | 7/2014 | Liaw |
| 11,127,455 | B2 | * | 9/2021 | Teman ................ H01L 23/528 |
| 2021/0166751 | A1 |   | 6/2021 | Teman et al. |

* cited by examiner

*Primary Examiner* — Xiaochun L Chen
(74) *Attorney, Agent, or Firm* — Nixon & Vanderhye P.C.

(57) ABSTRACT

A fin field-effect transistor (FinFET) based semiconductor memory array having a plurality of memory cells, each memory cell including a write transistor having a write wordline gate over a first fin connected to a write wordline gate contact, a write bitline contact in connection with the first fin, and a storage node contact in connection with the first fin, and a read transistor having a storage node gate over a second fin, the storage node gate connected to a storage node gate contact, the storage node gate contact connected to the storage node contact, a read wordline contact in connection with the second fin, and a read bitline contact in connection with the second fin, wherein the write wordline gate and the storage node gate are arranged in series to each other along an extension axis that coincides with an longitudinal axis of the write wordline gate and a longitudinal axis of the storage node gate.

20 Claims, 10 Drawing Sheets

Figure 1A:
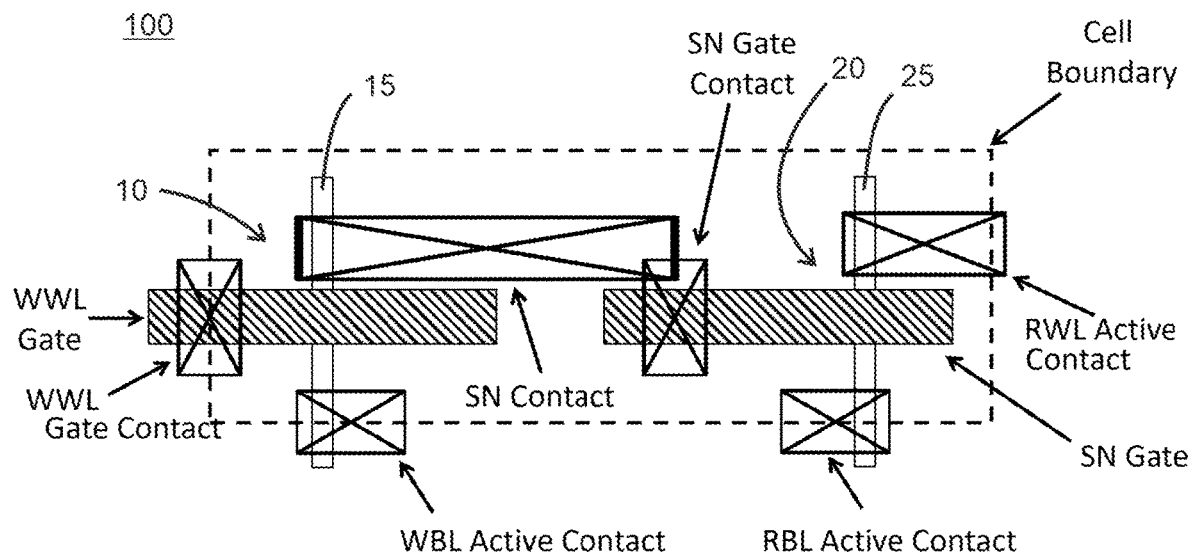

FIN FIELD-EFFECT TRANSISTOR (FinFET) BASED SEMICONDUCTOR MEMORY ARRAY HAVING MEMORY CELLS USING A REDUCED SURFACE AREA

FIELD OF THE INVENTION

The present invention is directed to the field of semiconductor memory design and layout, more specifically fin field-effect transistor (FinFET) technology based memory, for example a dynamic random access memory (DRAM), more specifically gain cell random access memory (GCRAM).

BACKGROUND

Generally, present semiconductor industry growth drivers, such as Artificial Intelligence (AI) and Machine Learning, 5G, Internet-of-Things (IOT), and automotive applications, require ever-increasing amounts of memory. However, off-chip accesses to external DRAM are up-to 1000× more costly in latency and power than access to on-chip memory. To limit this performance and power overhead, the amount of embedded memory on almost any integrated circuit or chip is reaching hundreds of megabits, accounting often for up to 75% of the total chip area.

Unfortunately, the cost of silicon is proportional to its area, especially in high volume manufacturing. With SRAM being the memory technology that dominates the die area, any density improvement in memory can significantly reduce the overall cost of the silicon. To make things worse, SRAM scaling beyond 10 nm process technologies has been facing significant scaling difficulties, leading to only 20%-25% reduced size between technology generations, as compared to 50% reduction in logic scaling. This further aggravates the memory bottleneck and significantly limits today's application from reaching thier performance and power efficiency potentials.

1T-1C embedded DRAM (eDRAM) is a traditional alternative to SRAM due to its higher memory density that can be achieved. However, this approach requires additional complex and costly process steps to fabricate the memory bitcell. Moreover, process scaling resulted in serious reliability issues in its fabrication, hence it is only available in very few and expensive process nodes and it is phased out beyond 14 nm. Gain-cell embedded DRAM (GC-eDRAM) is a fully logic-compatible alternative to SRAM, offering a smaller bitcell size, nondestructive read operation, and inherent two-ported functionality. GC-eDRAM can be implemented with as few as two (2) transistors to store a single bit of data, as opposed to six (6) to eight (8) transistors for SRAM, which is the predominant embedded memory technology. The lower transistor count per bit-cell provides up-to 50% area reduction in any standard CMOS process technology.

In addition to its surface area benefits, GC-eDRAM provides two ports of memory operation, as compared to the single-ported 6T SRAM and 1T-1C eDRAM. This feature offers increased memory bandwidth which is particularly useful in high-performance systems. Furthermore, GC-eDRAM enables a significantly more robust voltage scaling capabilities compared to SRAM and eDRAM, enabling up-to 10× reduction in power as compared to existing embedded memory solutions. As opposed to other high-density memory technologies, for example eDRAM and RRAM, GC-eDRAM is fully logic compatible with any CMOS process and requires no additional masks or process steps, thus it can be easily integrated in existing systems. Furthermore, the memory interface (input/output ports) and memory operation is designed to match existing embedded memory solutions based on SRAM in order to ease its integration in existing systems with very low overheads.

Recently, GC-eDRAM cell designs have developed using FinFET transistors, in which the conduction channel is raised above the substrate using a fin structure that allows the gate to be placed on two or more sides of the channel, resulting in an improved conduction and leakage control. The FinFET is a metal-oxide-semiconductor field-effect transistor (MOSFET) built on a substrate where the gate can be placed on two, three, or four sides of the channel or wrapped around the channel, forming a double or even multi gate structure. Because the source/drain region can form a fin or a ridge-like structure on the silicon surface, these device bear the name "FinFET." The FinFET devices can have significantly faster switching times and higher current density than planar complementary metal-oxide-semiconductor (CMOS) transistors.

For example, U.S. Pat. No. 8,779,528 that is herewith incorporated by reference in its entirety generally describes the use of FinFET technology for the semiconductor memories, and describing a Static Random Access Memory (SRAM) cell including a first pull-up Fin Field-Effect Transistor (FinFET) and a second pull-up FinFET, and a first pull-down FinFET and a second pull-down FinFET forming cross-latched inverters with the first pull-up FinFET and the second pull-up FinFET.

U.S. Patent Publication No. 2021/0166751 that is herewith incorporated by reference in its entirety generally describes a dynamic random access memory (DRAM) cell design using FinFET technology, where a gain cell is used, the gain cell including a write port, a read port and a storage node. The write port includes at least one write FinFET transistor and has a write word-line (WWL) input configured for inputting a write trigger signal and a write bit-line (WBL) input configured for inputting a data level for storing in the gain cell.

However, despite all the advancements in the field of FinFET based memory devices, and in the field of DRAM memory architectures and layouts, for example GC-eDRAM cell designs, more sophisticated designs and circuit layouts for FinFET based memory devices are desired, specifically to further reduce a chip surface area used for a memory cell or a corresponding memory array.

SUMMARY

According to one aspect of the present invention, a fin field-effect transistor (FinFET) based semiconductor memory array having a plurality of memory cells is provided. Preferably, each memory cell includes a write transistor having a write wordline gate in connection with a first fin connected to a write wordline gate contact, a write bitline contact in connection with the first fin, and a storage node contact in connection with the first fin, and a read transistor having a storage node gate in connection with a second fin, the storage node gate connected to a storage node gate contact, the storage node gate contact connected to the storage node contact, a read wordline contact in connection with the second fin, and a read bitline contact in connection with the second fin. Moreover, preferably, the write wordline gate and the storage node gate are arranged in series to each other along an extension axis that coincides with an longitudinal axis of the write wordline gate and a longitudinal axis of the storage node gate. Also, according to an aspect of the present invention, a corresponding FinFET based memory cell is provided, where the write wordline gate and the storage node gate are arranged in series to each other along an extension axis that coincides with an longitudinal axis of the write wordline gate and a longitudinal axis of the storage node gate.

According to another aspect of the present invention, a memory cell is provided, where preferably a dummy gate extends to be in connection with both the first fin and the second fin, arranged to be in parallel with the extension axis, the dummy gate shared with a neighboring memory cell. Accordign to still another aspect of the present invention, the memory cell can further include a third fin extending next to and in parallel to the first fin, the dummy gate, the storage node SN gate contact, the write wordline WWL gate, and the write bitline WBL contact in connection with the third fin, and/or a fourth fin extending next to and in parallel to the second fin, the dummy gate, the read wordline RWL contact, and the storage node SN gate in connection with the third fin.

According to yet another aspect of the present invention, another fin field-effect transistor (FinFET) based semiconductor memory array having a plurality of memory cells is provided. Preferably, each memory cell includes a write transistor having a write wordline gate over a first fin connected to a write wordline gate contact, a write bitline contact in connection with the first fin, and a storage node contact in connection with the first fin, a read transistor having a storage node gate over the first fin, the storage node gate connected to a storage node gate contact, the storage node gate contact connected to the storage node contact, a read wordline contact in connection with the first fin, and a read bitline contact in connection with the first fin, and a dummy gate extending to be in connection with the first fin. Moreover, preferably, the write wordline gate, the storage node gate, and the dummy gate are arranged to be in parallel to each other. Also, according to an aspect of the present invention, a corresponding Fini-ET based memory cell is provided, where the write wordline gate, the storage node gate, and the dummy gate are arranged to be in parallel to each other.

The above and other objects, features and advantages of the present invention and the manner of realizing them will become more apparent, and the invention itself will best be understood from a study of the following description with reference to the attached drawings showing some preferred embodiments of the invention.

BRIEF DESCRIPTON OF THE SEVERAL VIEWS OF THE DRAWINGS

The accompanying drawings, which are incorporated herein and constitute part of this specification, illustrate the presently preferred embodiments of the invention, and together with the general description given above and the detailed description given below, serve to explain features of the invention.

Figure 1B:
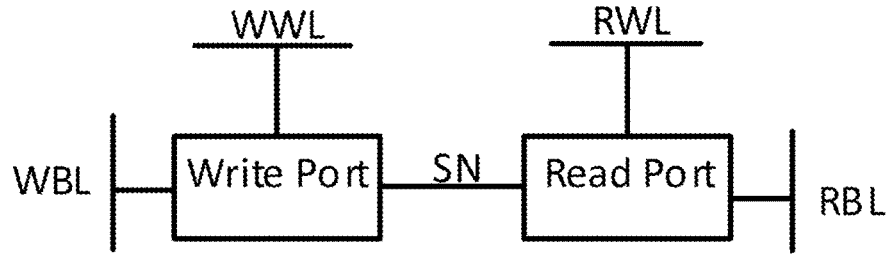
Figure 1C:
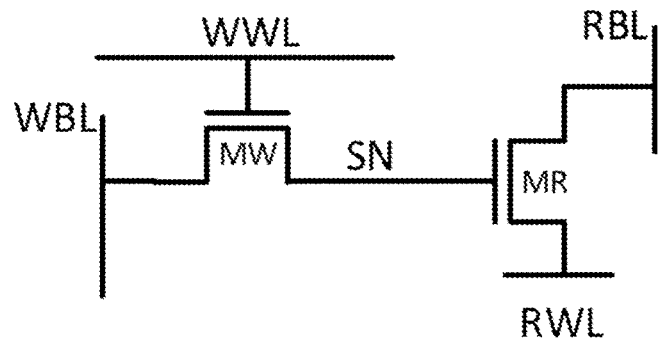
Figure 2A:
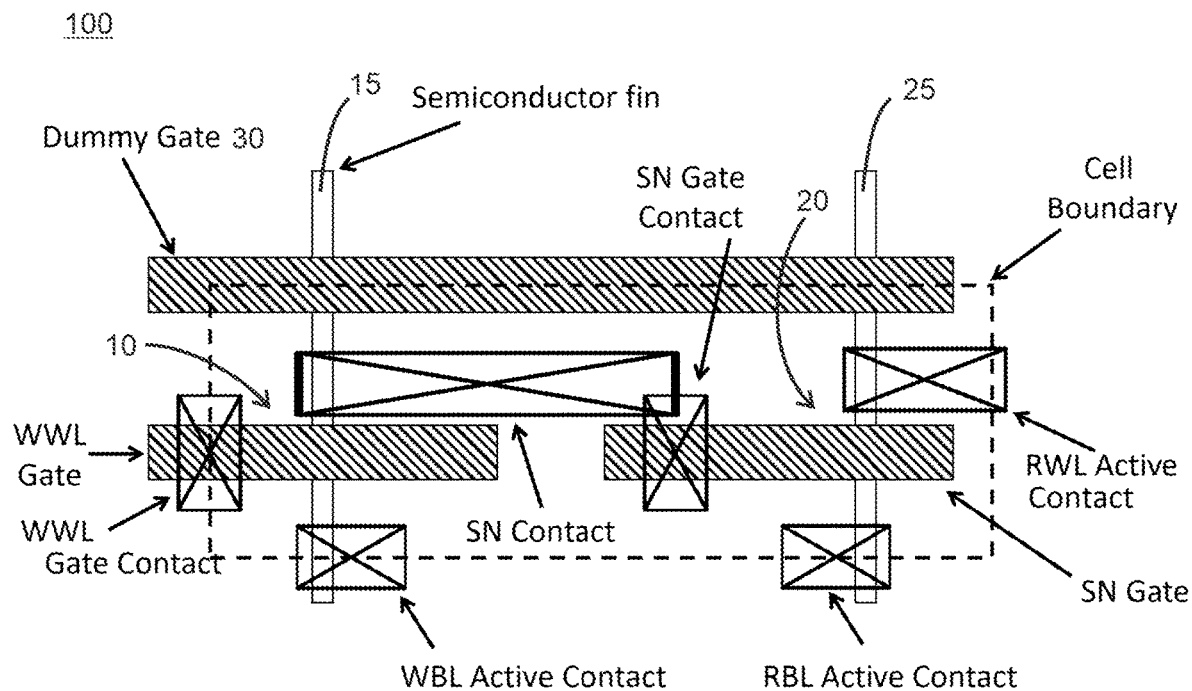
Figure 2B:
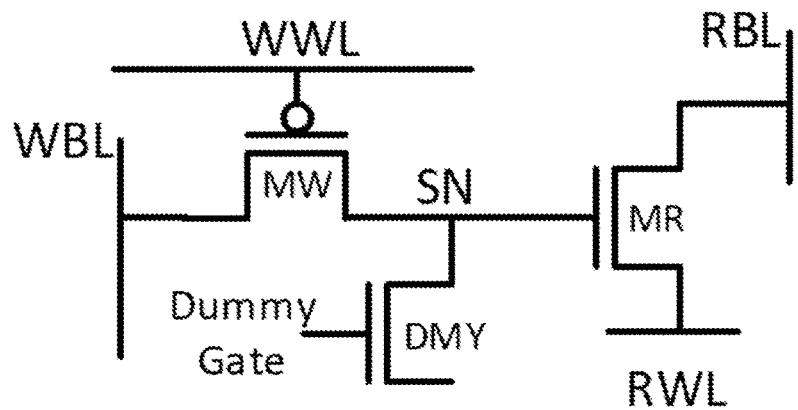
Figure 3:
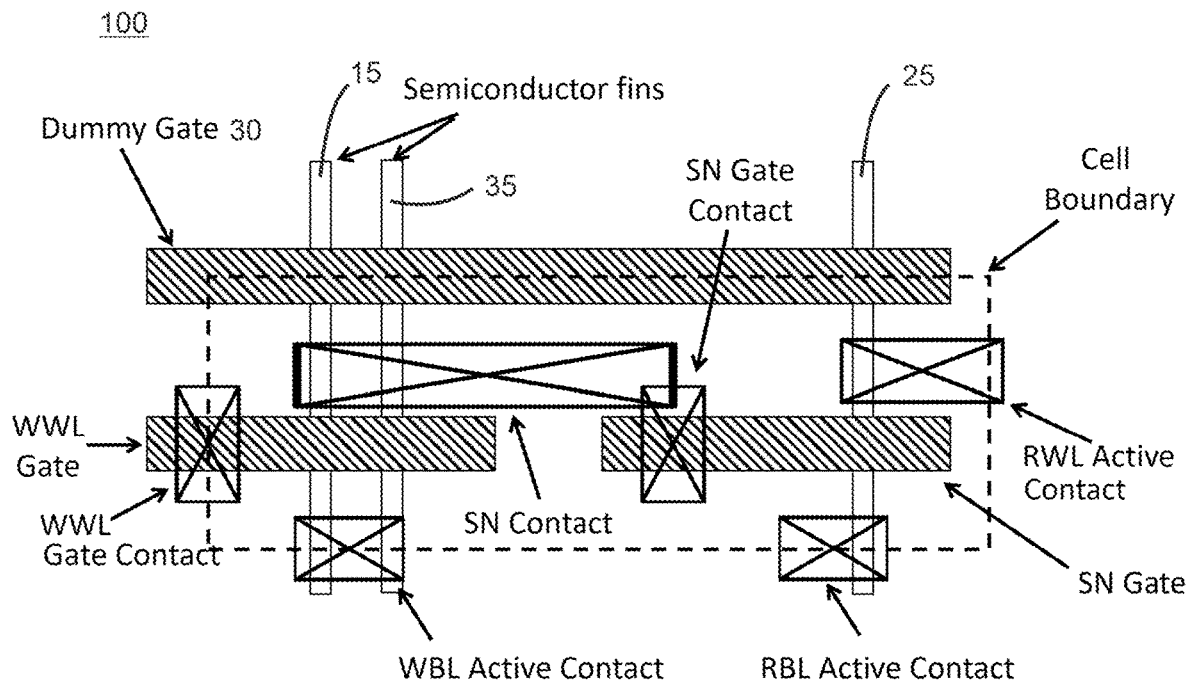
Figure 4:
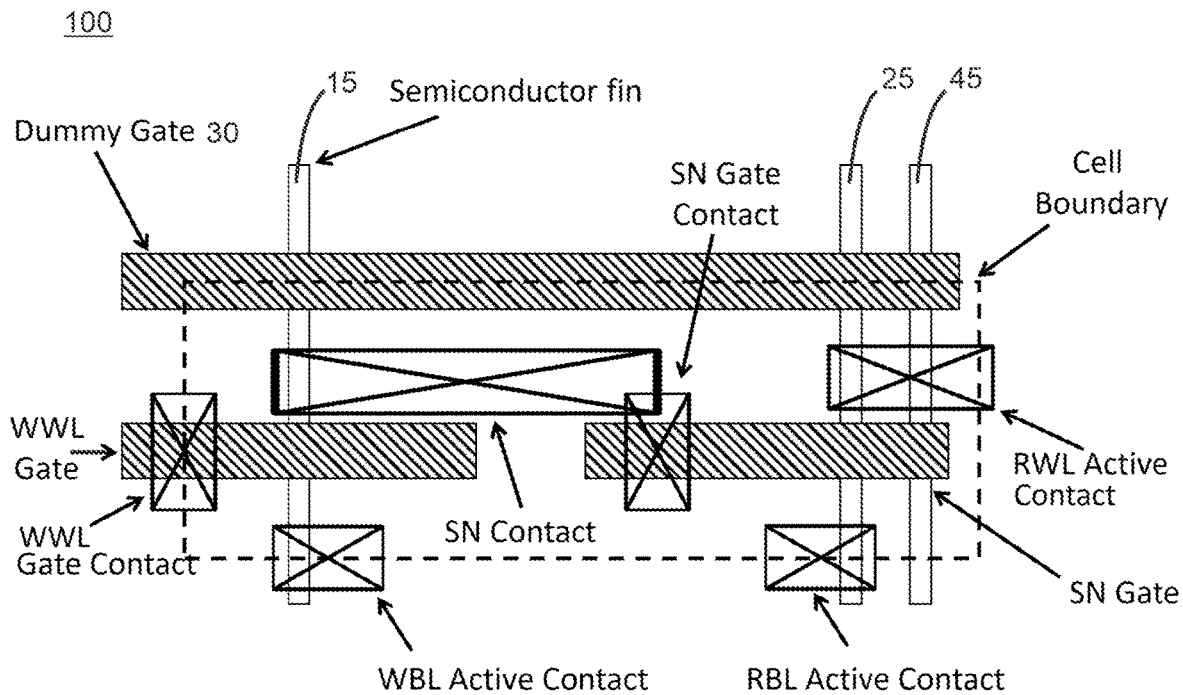
Figure 5:
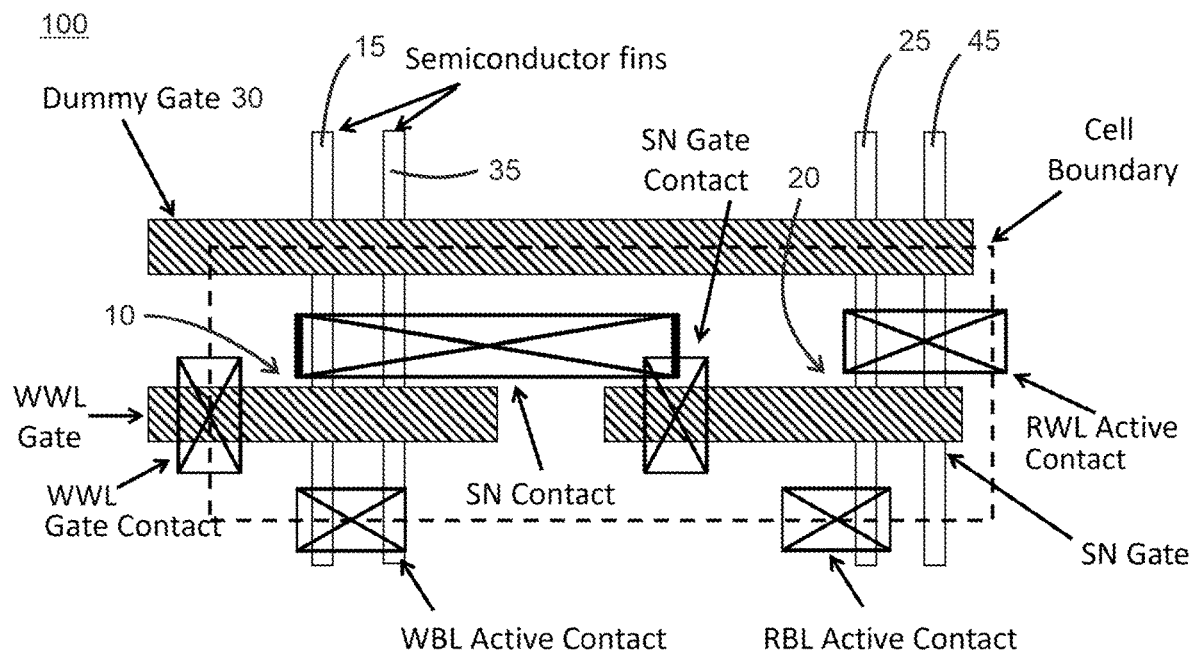
Figure 6:
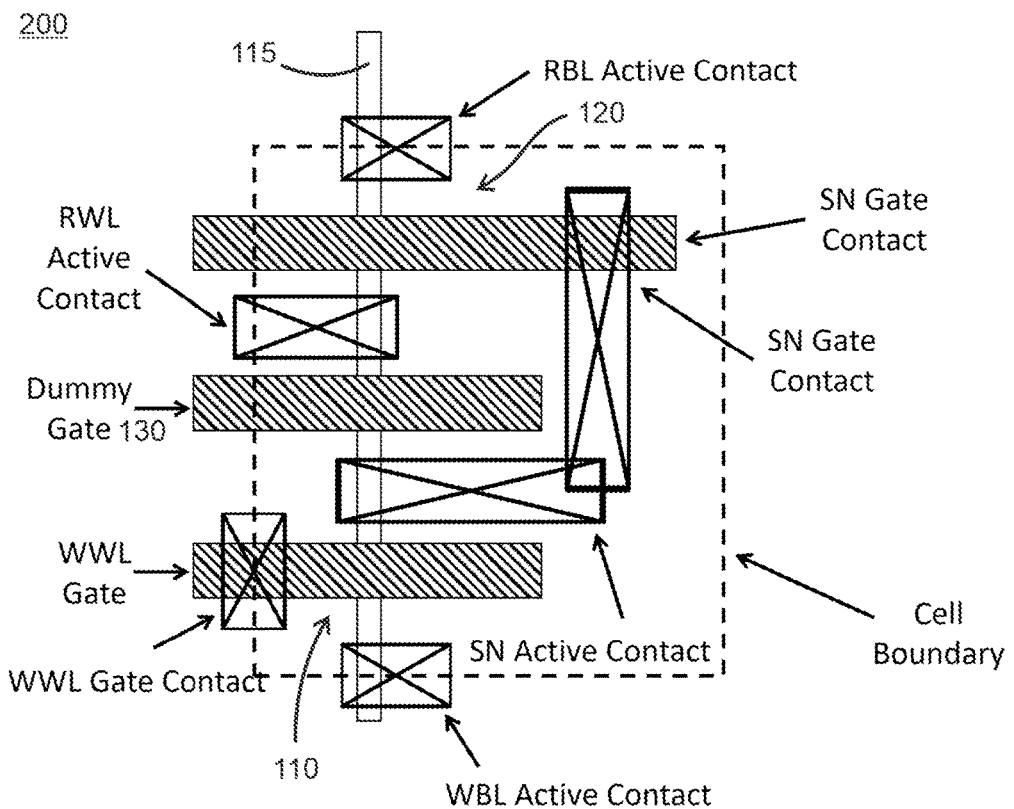
Figure 7:
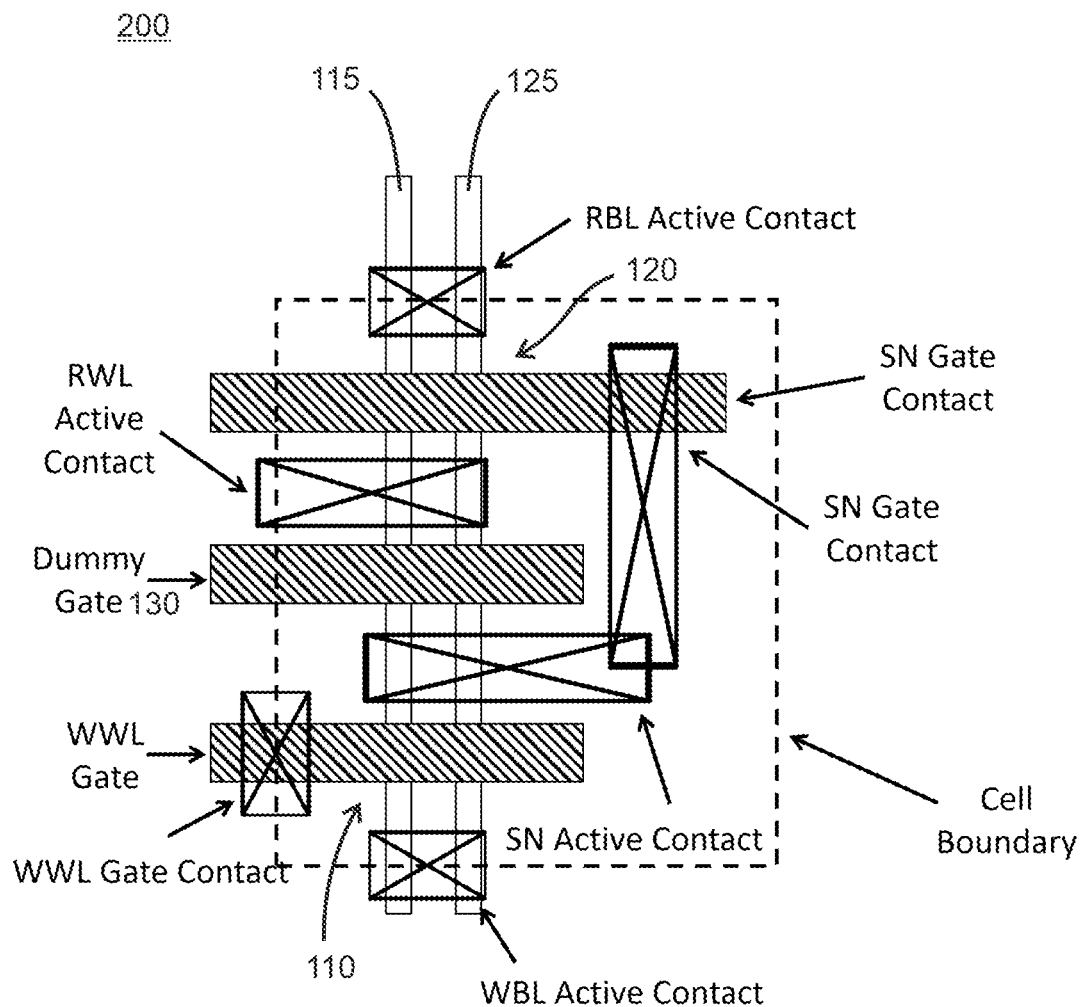
Figure 8:
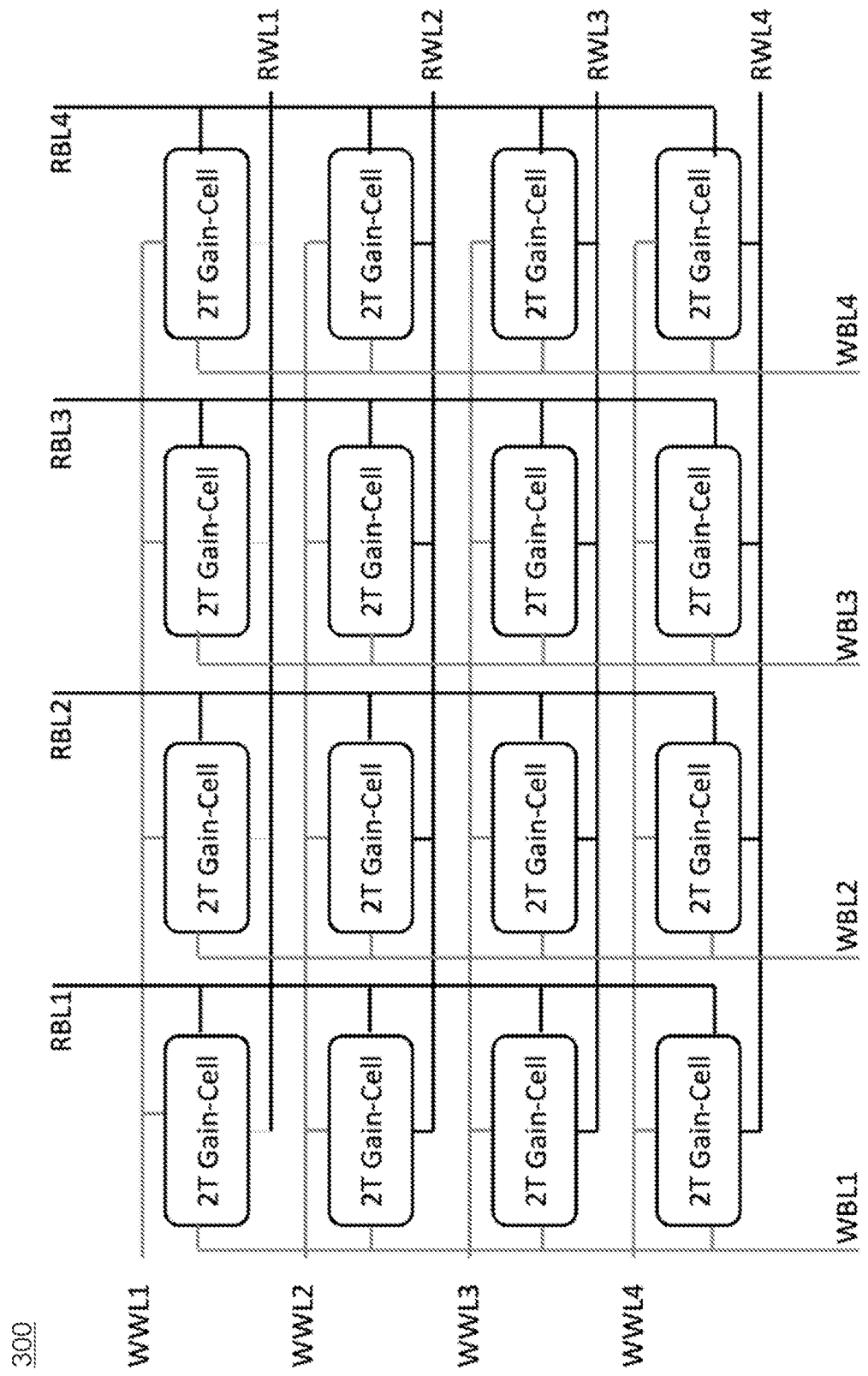
Figure 9:
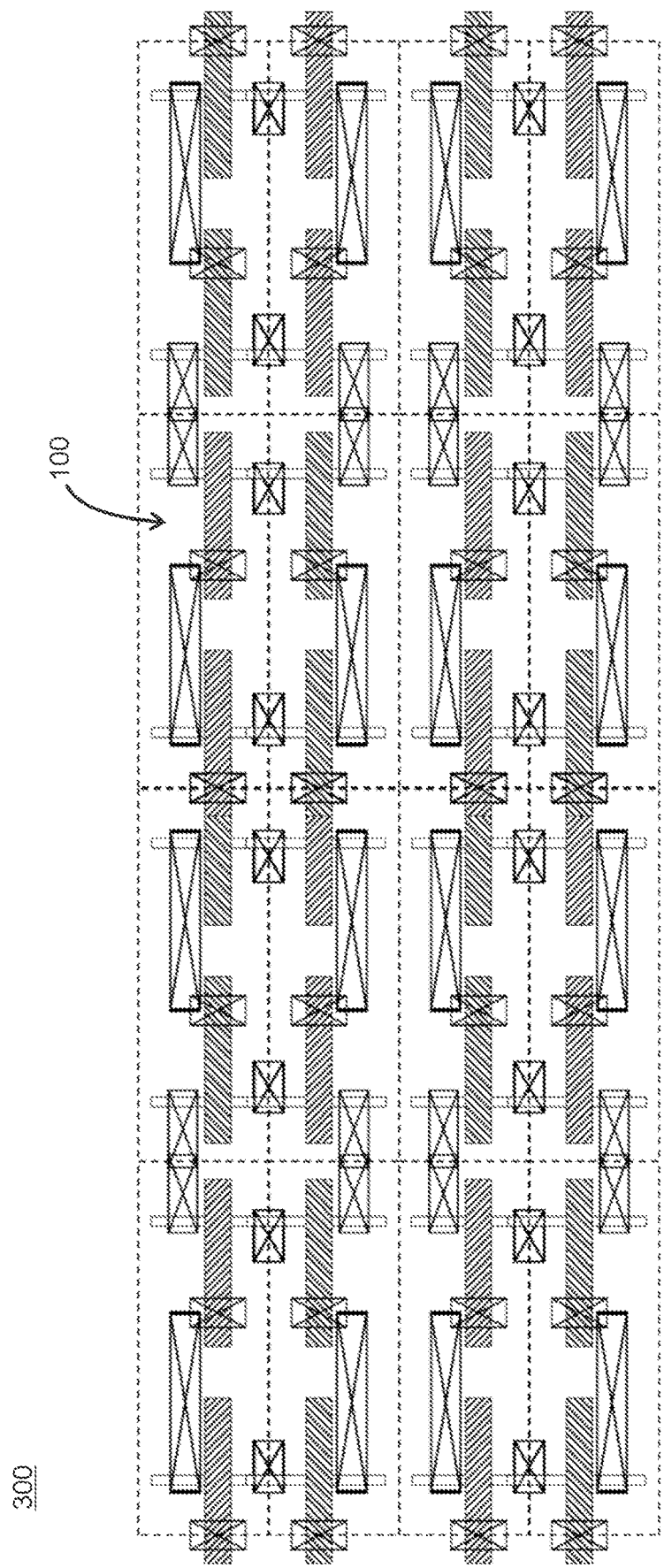
Figure 10:
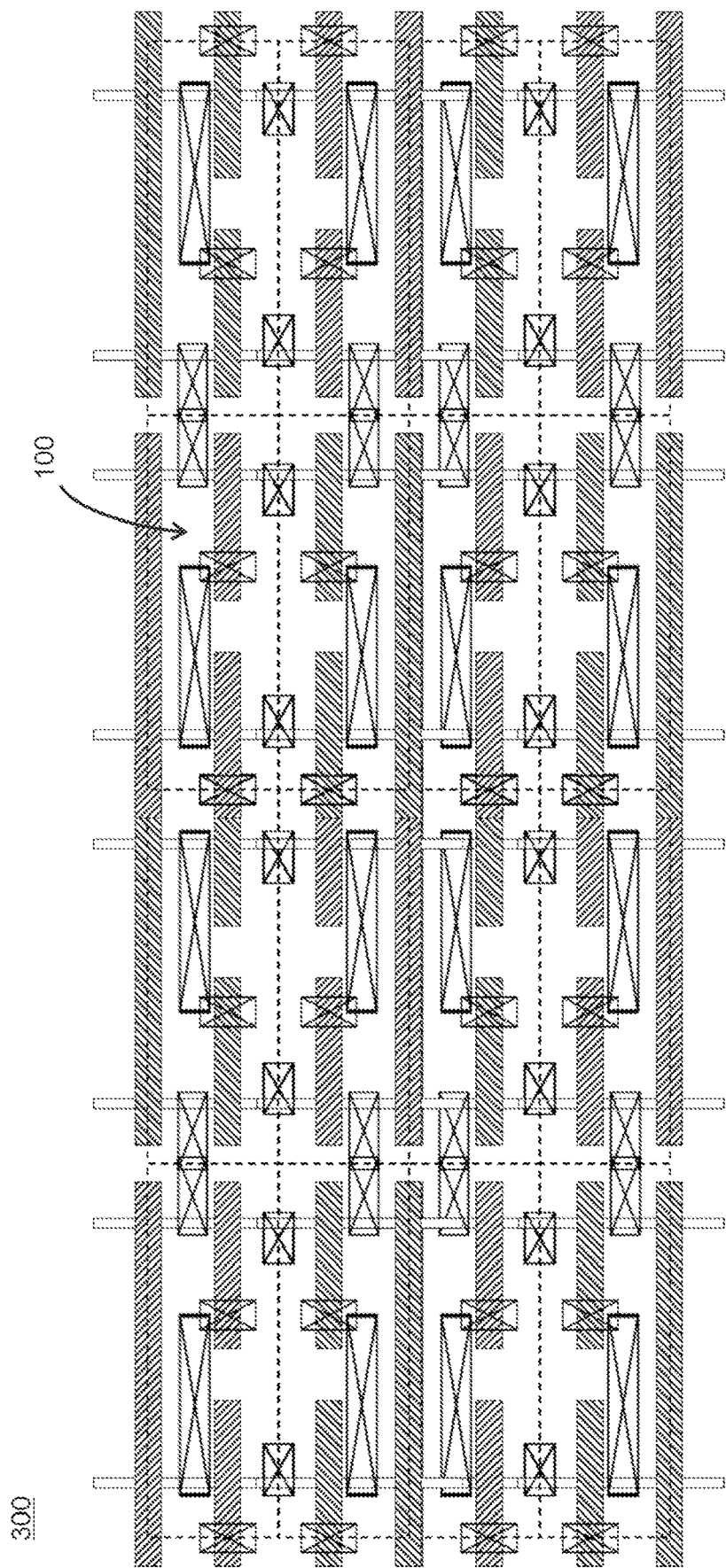
Figure 11:
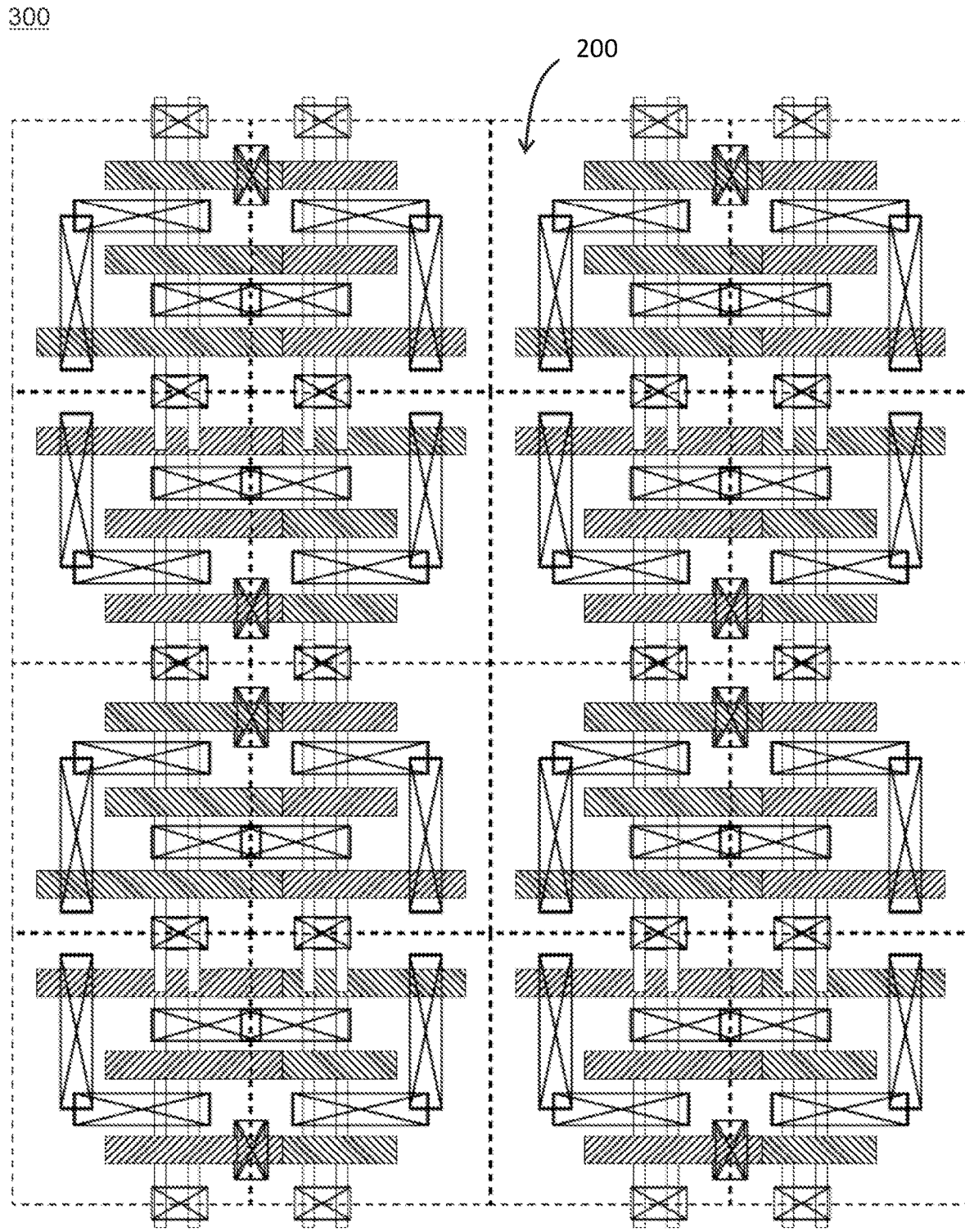
Figure 12:
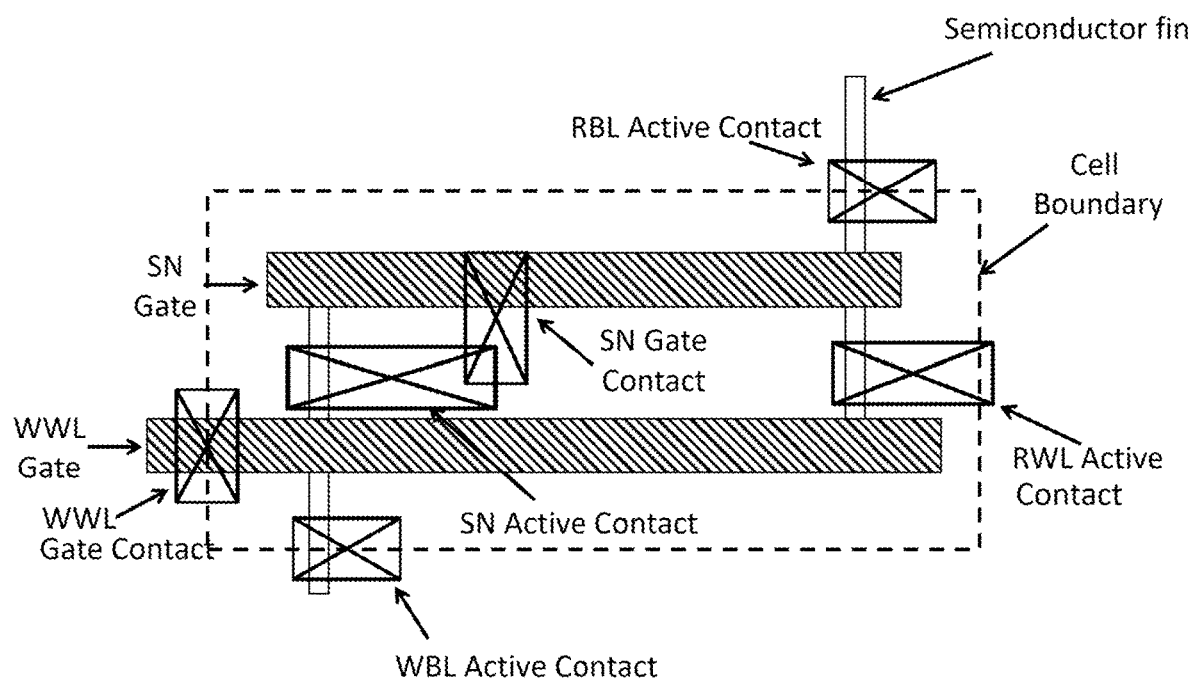

FIGS. 1A-1C show exemplary aspects of a memory cell 100 that can be used for a fin field-effect transistor (FinFET) based semiconductor memory array, with FIG. 1A showing an exemplary semiconductor layout of the memory cell using a reduced surface area as compared to state-of-the-art designs by having requiring only one and a half gate pitch lines for manufacturing, FIG. 1B showing a simplified block diagram representation of the memory cell with the different signals, and FIG. 1C showing a circuit diagram of the memory cell, according to a first embodiment of the present invention;

FIGS. 2A and 2B show exemplary aspects of a memory cell 100 that can be used for a fin field-effect transistor (FinFET) based semiconductor memory array having a dummy gate 30, with FIG. 2A shows an exemplary semiconductor layout of the memory cell using a reduced surface area as compared to state-of-the-art designs, and FIG. 2B showing a circuit diagram of the memory cell, according to a second embodiment of the present invention;

FIG. 3 shows an exemplary semiconductor layout of the memory cell 100 that can be used for a fin field-effect transistor (FinFET) based semiconductor memory array, having a dummy gate 30 and using two paralelly-arranged semiconductor fins 15, 35 at the write transistor 10, according to a third embodiment of the present invention;

FIG. 4 shows an exemplary semiconductor layout of the memory cell 100 that can be used for a fin field-effect transistor (FinFET) based semiconductor memory array, having a dummy gate 30 and using two parallely-arranged semiconductor fins 25, 45 at the read transistor 20, according to a fourth embodiment of the present invention;

FIG. 5 shows an exemplary semiconductor layout of the memory cell 100 that can be used for a fin field-effect transistor (FinFET) based semiconductor memory array, having a dummy gate 30 and using two parallely-arranged semiconductor fins 15, 35 at the write transistor 10 and two parallely-arranged semiconductor fins 25, 45 at the read transistor 20, according to a fifth embodiment of the present invention;

FIG. 6 shows an exemplary semiconductor layout of the memory cell 200 that can be used for a fin field-effect transistor (FinFET) based semiconductor memory array, having a write wordline WWL gate, a storage node SN gate, and a dummy gate 130 are arranged to be in parallel to each other, according to a sixth embodiment of the present invention;

FIG. 7 shows an exemplary semiconductor layout of the memory cell 200 that can be used for a fin field-effect transistor (FinFET) based semiconductor memory array, having a write wordline WWL gate, a storage node SN gate, and a dummy gate 130 are arranged to be in parallel to each other, and including two parallelly-arrange semiconductor fins 115, 125, according to a seventh embodiment of the present invention;

FIG. 8 shows an exemplary schematic representation of a 4×4 two-transistor (2T) gain-cell memory array;

FIG. 9 shows an exemplary schematic representation of a layout for a 4×4 two-transistor (2T) gain-cell memory array 300 using one and a half (1.5) gate pitches, two (2) fins 15, 25, with no dummy gate, based on a individual cell layout shown in in FIG. 1A, with a pairwise mirror-symmetric arrangement of two neighboring cells mirrored along a hortizontal and vertical direction for array integration, according to an aspect of the present invention;

FIG. 10 shows another exemplary schematic representation of a layout for a 4×4 two-transistor (2T) gain-cell memory array 300 using one and a half (1.5) gate pitches, two (2) fins 15, 25, and a dummy gate 30, based on a individual cell layout embodiment shown in in FIG. 2A, with a pairwise mirror-symmetric arrangement of two neighboring cells mirrored along a hortizontal and vertical direction for array integration, according to another aspect of the present invention;

FIG. 11 shows still another schematic representation of a layout for a 4×4 two-transistor (2T) gain-cell memory array 300 using one three (3) gate pitches, two (2) fins 115, 125 and a dummy gate 130, based on a individual cell layout embodiment shown in in FIG. 7, with a pairwise mirror-symmetric arrangement of two neighboring cells mirrored along a hortizontal and vertical direction for array integration, according to yet another aspect of the present invention; and FIG. 12 shows a two transistor (2T) gain-cell layout utilizing two (2) gate pitches and two (2) fins, according to a layout of the state-of-the art.

DETAILED DESCRIPTION OF THE SEVERAL EMBODIMENTS

According to a first embodiment of the present invention, a memory cell 100 and a corresponding memory cell array 300 is provided, that is based on fin field-effect transistor (FinFET) technology, the memory cell array including a plurality of memory cells 100, where FIG. 1A shows an exemplary semiconductor layout representation of the memory cell 100 using a reduced surface area as compared to state-of-the-art designs, FIG. 1B showing a simplified block diagram representation of the memory cell 100 with the different signals, and FIG. 1C showing a circuit diagram of the memory cell 100. The corresponding memory array layout, exemplarily illustrated as a 4×4 matrix of two-transistor (2T) gain-cell memory array 300, is shown in FIG. 9 as a non-limiting embodiment.

As illustrated in FIG. 1A, the memory cell 100 includes two transistors 10, 20 to be based on a two-transistor (2T) random access memory (RAM) architecture, with a write transistor 10 having a write wordline WWL gate in connection with a first fin 15 connected to a write wordline WWL gate contact, a write bitline WBL contact in connection with the first fin 15, and a storage node SN contact in connection with the first fin 15. Moreover, a read transistor 20 is provided having a storage node SN gate in connection with a second fin 25, the storage node SN gate connected to a storage node SN gate contact, the storage node SN gate contact connected to the storage node SN contact, a read wordline RWL contact in connection with the second fin 25, and a read bitline RBL contact in connection with the second fin 25. With respect to the write wordline WWL gate contact, the write bitline WBL contact, the storage node SN contact, the read wordline RWL contact, the read bitline RBL contact, these contacts can be embodied as different types of structures that allow to provide for an electric interconnection between different layers, for example metal, vias, conductive diffusions. For example, the contacts can be formed by the use of different types of conductive materials, for example metals such as Copper (Cu), Aluminum (Al), Cobalt (Co) which allow to create conductive channels, connections or posts across the different levels of the routing layers, for example but not limited to Gate/Diffusion with Metal-0, Metal 1 with Metal 0, etc.

Moreover, the write wordline WWL gate and the storage node SN gate can be formed as longtidunally-extending conductive structures that are arranged in series to each other along an extension axis that coincides with an longitudinal axis of the write wordline WWL gate and a longitudinal axis of the storage node SN gate. In other words, the write wordline WWL gate and the storage node SN gate can be formed to share the same pitch line of the manufacturing process. In addition, the write wordline WWL gate is preferably not arranged to be in connection or in contact with the second fin 25, and the storage node SN gate is not arranged to be in connection or in contact with the first fin 15. With the layout that is provided by FIG. 1A, as compared to the layout of FIG. 2A, there is no dummy gate, and the first and second fins 15, 25 do not continue into the adjacent or neighboring upper memory cell, and are physically cut, removed or not present, and are therefore not continuous between memory cells of the same column.

In the memory array 300 illustrated in FIG. 9, first and second fins 15, 25, the write bitline WBL contact, and the read bitline RBL contact are shared with a neigboring or adjacent memory cell that is mirror-symmetrically arranged below the memory cell 100 mirrored by a horizontal line of the cell boundary, with reference to the illustration shown in FIG. 1A, but first and second fins 15, 25 do not lead into the adjacent memory cell located above. The outer boundaries of one memory cell 100 are illustrated using a dashed line, shown as a rectangle. Also, write wordline WWL gate and write wordline WWL gate contact are shared with a neigboring or adjacent memory cell that is mirror-symmetrically arranged at the left boundary the memory cell 100 mirrored by a vertical line of the cell boundary, again in reference to FIG. 1A. Moreover, the read wordline RWL contact can be shared or is electrically connected to another read wordline RWL contact with a neigboring or adjacent memory cell that is mirror-symmetrically arranged at the right boundary of the memory cell 100 mirrored by a vertical line of the cell boundary, again in reference to FIG. 1A. With such layout of memory cell 100, and corresponding memory array 300, according to an aspect of the present invention, it is possible to provide a memory cell layout, for example a gain cell embedded dynamic random access memory (GC-eDRAM) cell layout, which enables to reduce the memory footprint utilizing only the conventional masks and process steps used in a given process, without any additional process changes, with the two different gates of read and write transistor 10, 20 being arranged in series with the same gate pitch line.

As illustrated in FIG. 1C with a non-limiting schematic representation of the memory cell 100, the write transistor 10 or MW is formed by the WWL gate electrode connected to the WWL line and the underlying first semiconductor fin 15, whose active regions are connected to the WBL and SN lines via the WBL contact and SN contact. The read transistor 20 or MR is formed by the gate electrode connected to the RWL line and the underlying second semiconductor fin 25, whose active regions are connected to the RWL and RBL lines, via the RWL contact and the RBL contact.

The WWL gate contact is used to connect the WWL gate electrode to an upper metal layer which is used to route the WWL signal across all the memory cells in a corresponding memory row of a memory array. In addition, the RWL contact is used to connect the RWL diffusion to an upper metal layer which is used to route the RWL signal across all the memory cells in the corresponding memory row of the memory array. The WBL and RBL contacts are used to connect the diffusions of the write and read transistors 10, 20, respectively, to higher metal levels which are used to route the WBL and RBL signals across all the memory cells in the memory column of the memory array. A simplified schematic of an exemplary 4×4 memory array 300 with exemplary four (4) memory row and four (4) memory columns and their interconnections is provided by FIG. 8. A long SN contact, shown in FIG. 1A to extend horizontally, connected to the active region of the write transistor 10, and an SN gate contact, connected to the gate electrode of the read transistor 20, create an electrical short to form the 2T Gain-Cell.

According to the types of write and read transistor 10, 20 that are chosen, for example NMOS or PMOS, each of the write and read regions can be implemented inside either N-well or P-well regions. Furthermore, each of the transistor types can be implemented with different threshold voltage (VT) device types, such as Low-VT, High-VT, Standard-VT, or any other VT flavor available in the process technology.

The herein presented embodiments of the present invention provide for significant improvement to existing memory cell layouts for FinFET technology by substantially reducing a surface area of the semiconductor used per memory cell and an increase of density, as well as improved performance and reduced power consumption achieved by the shorter control lines carrying less parasitic resistance and capacitance. Existing FinFET based implementations of two-transistor GC-eDRAM require at least two (2) gate pitches, composed of two transistor gate electrodes positioned in parallel at a minimum allowed distance and minimum allowed length, and at least two semiconductor fin implementing the write and the read transistors of the 2T GC-eDRAM bitcell. With at least some aspects of the embodiments herein, novel memory cell layout structures are being proposed which enable to increase the density of the two-transistor GCRAM cell by implementing the cell layout using a lower number of gate pitches or a lower number of semiconductor fins, or both. In other words, with the herein presented embodiments, it is possible to provide for a memory cell layout which reduces the memory footprint of many types of digital circuits to be scaled down to feature sizes of 5 nm or smaller using currently existing conventional masks and impurity implantation of existing FinFET fabrication processes.

Generally, as illustrated in FIGS. 1B and 1C, a 2-transistor (2T) GC-eDRAM cell includes a write transistor which can be implemented with either an NMOS or a PMOS transistor device, with a gate of the write transistor connected to the write word line WWL, and a diffusion connected to the write bit-line WBL and storage node SN. The diffusions are the Source and Drain terminals of the transistor. Also, a read transistor can also be implemented with either a PMOS or an NMOS transistor device, with a gate of the read transistor connected to the SN, and a diffusions thereof connected to the read word line RWL and read bit-line RBL. An illustration of background art 2T GC-eDRAM layout is shown in FIG. 12, where it can be seen that the vertical length of the cell boundary is determined by the pitch of two (2) gate electrodes, used to connect the write and read transistor gate signals, and two fins, used to create the write and read transistor active regions.

According to a second embodiment of the present invention, and as illustrated in FIG. 2A, the memory cell 100 can further include a dummy gate 30, showing a two transistor (2T) gain cell random access memory (GCRAM) bitcell layout. FIG. 10 shows a corresponding memory array 300 with a 4×4 memory cell arrangenement using the memory cell layout of FIG. 2A. Dummy gate 30 can extend to be in connection with both the first fin 15 and the second fin 25, arranged to be in parallel with the extension axis. This memory cell 100 uses two (2) semiconductor fins and one-and-a half (1.5) gate pitches, as dummy gate 30 is shared with a neighnoring memory cell 100 having a mirror-symmetric arrangement. Moreover, the first and second fins 15, 25 can be continuous and can be shared with the other memory cells 100 of the same memory cell column, but can be cut off or removed under dummy gate 30. The outer boundaries of the cell are illustrated using a dashed line, shown as a rectangle. The lower boundary of the cell cuts the write bitline WBL contact, and the read bitline RBL contact, which again are shared by the adjacent cell which is placed mirror-symmetrically underneath the memory cell 100 illustrated in FIG. 2A, and shares the same write bitline WBL and read bitline RBL. As can be further seen, the upper boundary line of the cell boundary lies substantially in the middle of the width of the gate electrode of a dummy gate 30. The dummy gate 30 is used to electrically disconnect the dummy transistor formed by the dummy gate and underlying semiconductor fins 15, 25 by either physically cutting off the semiconductor fin 15, 25 located underneath the dummy gate 30, or by connecting the dummy gate 30 to a voltage which puts the dummy transistor to an OFF state. FIG. 2B illustrates a schematic of an example of a 2T GC-eDRAM memory cell which includes the dummy transistor generated by the layout for the case where it is not physically cut off, but rather connects to a signal to the dummy gate 30 to electrically turn it off. With the use of the dummy gate 30 of a dummy transistor, it is possible to add more beneficial capacitance to the SN node, which can improve the data retention time of the bitcell by storing more charge, thereby extending the refresh period.

Furthermore, according to a third embodiment of the present invention, and as illustrated in FIG. 3, the memory cell 100 can further include a third fin 35 extending next to and in parallel to the first fin 15, with the dummy gate 30, the storage node SN gate contact, the write wordline (WWL) gate, and the write bitline (WBL) contact in connection with the third fin 35. The third embodiment is a variant of the layouts for a 2T GC-eDRAM cell utilizing 1.5 gate pitches. In this respect, a 2T GC-eDRAM memory cell layout is shown that utilizes two (2) semiconductor fins 15, 35 to form the write transistor 10 and one semiconductor fin 25 to from the read transistor 20. The use of two or more semiconductor fins 15, 35 that are arranged in parallel to form transistors allows reduce crosstalk between adjacent bitcells.

Furthermore, according to a fourth embodiment of the present invention, and as illustrated in FIG. 4, instead of having a third fin 35, the memory cell 100 can further include a fourth fin 45 extending next to and in parallel to the second fin 25, with the dummy gate 30, the read wordline RWL contact, and the storage node SN gate in connection with the third fin 35, thereby providing for. a 2T GC-eDRAM which utilizes one semiconductor fin 15 to form the write transistor 10 and two semiconductor fins 25, 45 to from the read transistor 20.

Furthermore, according to a fourth embodiment of the present invention, and as illustrated in FIG. 5, the memory cell includes both a third fin 35 extending next to and in parallel to the first fin 15, with the dummy gate 30, the storage node SN gate contact, the write wordline WWL gate, and the write bitline WBL contact in connection with the third fin 35 and a fourth fin 45 extending next to and in parallel to the second fin 25, the dummy gate 30, the read wordline RWL contact, and the storage node SN gate in connection with the third fin 35. The fourth embodiment, a 2T GC-eDRAM is provided which utilizes two semiconductor fins 15, 35 to form the write transistor 10 and two semiconductor fins 25, 45 to from the read transistor 20. Other variants of these embodiments are also possible, with write transistor 10 having more than two (2) semiconductor fins, and read transistor 20 having more than two (2) semiconductor fins.

FIG. 6 illustrates a layout of 2T GC-eDRAM memory bitcell 200, using one (1) semiconductor fin and three (3) gate pitches, according to a fifth embodiment of the present invention, providing for a narrower column and wider row design. The memory cell 200 includes a write transistor 110 having a write wordline WWL gate over a first fin 115 connected to a write wordline WWL gate contact, a write bitline WBL contact in connection with the first fin 115, and a storage node SN contact in connection with the first fin 115, a read transistor 120 having a storage node SN gate over the first fin 115, the storage node SN gate connected to a storage node SN gate contact, the storage node SN gate contact connected to the storage node SN contact, a read wordline RWL contact in connection with the first fin 115, and a read bitline RBL contact in connection with the first fin 115, and a dummy gate 130 extending to be in connection with the first fin 115. Moreoveer, the write wordline WWL gate, the storage node SN gate, and the dummy gate 130 are arranged to extended in parallel to each other, along three (3) different gate pitches of the manufacturing process. In addition, this layout can merely use a single continuous fin 115 for both the diffusions or channels of the read and write transistors 110, 120. Moreover, the dummy gate 130 can be arranged between the storage node SN gate of the read transistor 120 and the write wordline WWL gate of the write transistor 110. Storage node SN gate, dummy gate 130, and WWL gate are arranged such that they extend into and are shared with a neigboring or adjacent memory cell of the memory row, for example a mirror-symmetrically arranged memory cell 200 to the left with respect to FIG. 6, also illustrated in the array layout of FIG. 11. Also, RWL contact and WWL gate contact can be shared with that same mirror-symmetrically arranged memory cell 200. In addition, RBL contact can be shared with the memory cell of the same memory column arranged above, and the WBL contact can be shared with the memory cell of the same memory column arranged below.

A first gate electrode with the WWL gate is used to define the write transistor 110 by connecting to the WWL signal, a second gate electrode forms a dummy gate 130 used to electrically and/or physically disconnect the write and read transistors 110, 120, and a third gate electrode with the SN gate is used to define the read transistor 120 by connecting to the SN signal. The RBL and WBL active contacts are shared by adjacent cells placed on the top and bottom cell boundaries, sharing the same RBL and WBL lines. The WWL and RWL contacts are shared by the adjacent cell on the left boundary of the drawn cell and shares the same WWL and RWL lines. The transistors 110, 120 can be implemented with different threshold voltage (VT) device types, such as Low-VT, High-VT, Standard-VT, or any other VT flavor available in the process technology.

Furthermore, according to a six embodiment of the present invention, and as illustrated in FIG. 7, the memory cell 200 can further include a second fin 125 extending next to and in parallel to the first fin 115, wherein the read bitline RBL contact, the storage node SN gate, read wordline RWL contact, the dummy gate 130, the storage node SN contact, the write wordline WWL gate, and the write bitline WBL are also contact in connection with the second fin 125. In this respect, the first and second fins 115, 125, are continuously arranged throughout a memory column, and are used within a memory cell 200 for both the read and write transistor 110, 120, to from the transistor channel regions. An exemplary and non-limiting memory array 300 with the memory cell layout of FIG. 7 is shown in FIG. 11, with 4×4 memory cells.

The herein presented embodiments of the memory cell layouts 100, 200 can be implemented on a physical level with gate contacts and other active contacts that can be done using various interconnect levels available in the process, such as "OD" representing the "active region" level, via levels, for example but not limited to VIA0, VIA1, VIA2, or metal layers for example but not limited to M0, M1, M2. For example, the features in the gate contact level can connect gate electrodes of transistors, such as 10, 110, 20, 120 to an overlying level such as VIA0 level. Also, the features in the OD level can connect source and drain regions of transistors 10, 20, 110, 120, pickup regions of well regions, and the like to an overlying level such as the VIA0 level. The layout designs provided by FIGS. 1A, 2A, 3-7, and 9-11 do not present all the necessary process layers which are used to from a 2T gain-cell, but are limited to the basic structures which define the boundary of the cell, for illustration and explanary purposes.

While the invention has been disclosed with reference to certain preferred embodiments, numerous modifications, alterations, and changes to the described embodiments, and equivalents thereof, are possible without departing from the sphere and scope of the invention. Accordingly, it is intended that the invention not be limited to the described embodiments, and be given the broadest reasonable interpretation in accordance with the language of the appended claims.

The invention claimed is:

1. A fin field-effect transistor (FinFET) based semiconductor memory array (300) having a plurality of memory cells (100), each memory cell (100) comprising:
   a write transistor (10) having a write wordline (WWL) gate in connection with a first fin (15) connected to a write wordline (WWL) gate contact, a write bitline (WBL) contact in connection with the first fin (15), and a storage node (SN) contact in connection with the first fin (15); and
   a read transistor (20) having a storage node (SN) gate in connection with a second fin (25), the storage node (SN) gate connected to a storage node (SN) gate contact, the storage node (SN) gate contact connected to the storage node (SN) contact, a read wordline (RWL) contact in connection with the second fin (25), and a read bitline (RBL) contact in connection with the second fin (25),
   wherein the write wordline (WWL) gate and the storage node (SN) gate are arranged in series to each other along an extension axis that coincides with a longitudinal axis of the write wordline (WWL) gate and a longitudinal axis of the storage node (SN) gate.

2. The FinFET transistor based semiconductor memory array (300) according to claim 1, wherein the write wordline (WWL) gate is not arranged to be in connection with the second fin (25), and the storage node (SN) gate is not arranged to be in connection the first fin (15).

3. The FinFET transistor based semiconductor memory array (300) according to claim 1, each memory cell further comprising:
   a dummy gate (30) extending to be in connection with both the first fin (15) and the second fin (25), arranged to be in parallel with the extension axis, the dummy gate (30) shared with a neighboring memory cell in a same memory cell column.

4. The FinFET transistor based semiconductor memory array (300) according to claim 3, each memory cell further comprising:
   a third fin (35) extending next to and in parallel to the first fin (15), the dummy gate (30), the storage node (SN) gate contact, the write wordline (WWL) gate, and the write bitline (WBL) contact in connection with the third fin (35).

5. The FinFET transistor based semiconductor memory array (300) according to claim 3, each memory cell further comprising:
   a fourth fin (45) extending next to and in parallel to the second fin (25), the dummy gate (30), the read wordline (RWL) contact, and the storage node (SN) gate in connection with the third fin (35).

6. The FinFET transistor based semiconductor memory array (300) according to claim 3, each memory cell further comprising:
- a third fin (35) extending next to and in parallel to the first fin (15), the dummy gate (30), the storage node (SN) gate contact, the write wordline (WWL) gate, and the write bitline (WBL) contact in connection with the third fin (35); and
- a fourth fin (45) extending next to and in parallel to the second fin (25), the dummy gate (30), the read wordline (RWL) contact, and the storage node (SN) gate in connection with the third fin (35).

7. The FinFET transistor based semiconductor memory array (300) according to claim 1, wherein the write bitline (WBL) contact, the first fin (15), the read bitline (RBL) contact, and the second fin (25) are shared by a same neighboring memory cell of a corresponding memory cell column.

8. A fin field-effect transistor (FinFET) based semiconductor memory array (300) having a plurality of memory cells (200), each memory cell (200) comprising:
- a write transistor (110) having a write wordline (WWL) gate in connection with a first fin (115) connected to a write wordline (WWL) gate contact, a write bitline (WBL) contact in connection with the first fin (115), and a storage node (SN) contact in connection with the first fin (115);
- a read transistor (120) having a storage node (SN) gate over the first fin (115), the storage node (SN) gate connected to a storage node (SN) gate contact, the storage node (SN) gate contact connected to the storage node (SN) contact, a read wordline (RWL) contact in connection with the first fin (115), and a read bitline (RBL) contact in connection with the first fin (115); and
- a dummy gate (130) extending to be in connection with the first fin (115),
- wherein the write wordline (WWL) gate, the storage node (SN) gate, and the dummy gate (130) are arranged to be in parallel to each other.

9. The FinFET based semiconductor memory array (300) according to claim 8, wherein the dummy gate (130) is arranged between the storage node (SN) gate of the read transistor (120) and the write wordline (WWL) gate of the write transistor (110).

10. The FinFET based semiconductor memory array (300) according to claim 8, each memory cell further comprising:
- a second fin (125) extending next to and in parallel to the first fin (115),
- wherein the read bitline (RBL) contact, the storage node (SN) gate, read wordline (RWL) contact, the dummy gate (130), the storage node (SN) contact, the write wordline (WWL) gate, and the write bitline (WBL) are also contact in connection with the second fin (125).

11. The FinFET transistor based semiconductor memory array (300) according to claim 8, wherein at least one of the storage node (SN) gate, the dummy gate (130), and/or the write wordline (WWL) gate are shared by a same neighboring memory cell of a corresponding memory cell row.

12. The FinFET transistor based semiconductor memory array (300) according to claim 8, wherein the first fin (115) is continuous and shared by memory cells arranged in a same memory cell column of the memory cell (200).

13. The FinFET transistor based semiconductor memory array (300) according to claim 1, wherein the read transistor (10) and the write transistor (20) each include one of a N-type channel or a P-type channel.

14. The FinFET transistor based semiconductor memory array according to claim 8, wherein the read transistor (110) and the write transistor (120) each include one of a N-type channel or a P-type channel.

15. The FinFET transistor based semiconductor memory array (300) according to claim 1, wherein the read transistor (10) and the write transistor (20) are configured for one of a high threshold voltage, regular threshold voltage, or low threshold voltage.

16. The FinFET transistor based semiconductor memory array (300) according to claim 8, wherein the read transistor (110) and the write transistor (120) are configured for one of a high threshold voltage, regular threshold voltage, or low threshold voltage.

17. A fin field-effect transistor (FinFET) based memory cell (100) comprising:
- a write transistor (10) having a write wordline (WWL) gate in connection with a first fin (15) connected to a write wordline (WWL) gate contact, a write bitline (WBL) contact in connection with the first fin (15), and a storage node (SN) contact in connection with the first fin (15); and
- a read transistor (20) having a storage node (SN) gate in connection with a second fin (25), the storage node (SN) gate connected to a storage node (SN) gate contact, the storage node (SN) gate contact connected to the storage node (SN) contact, a read wordline (RWL) contact in connection with the second fin (25), and a read bitline (RBL) contact in connection with the second fin (25),
- wherein the write wordline (WWL) gate and the storage node (SN) gate are arranged in series to each other along an extension axis that coincides with a longitudinal axis of the write wordline (WWL) gate and a longitudinal axis of the storage node (SN) gate.

18. The FinFET transistor based memory cell of claim 16, wherein the write wordline (WWL) gate is not arranged to be in connection with the second fin (25), and the storage node (SN) gate is not arranged to be in connection the first fin (15).

19. The FinFET transistor based memory cell of claim 16, further comprising:
- a dummy gate (30) extending to be in connection with both the first fin (15) and the second fin (25), arranged to be in parallel with the extension axis, the dummy gate (30) shared with a neighboring memory cell in a same memory cell column.

20. A fin field-effect transistor (FinFET) based memory cell (200) comprising:
- a write transistor (110) having a write wordline (WWL) gate in connection with a first fin (115) connected to a write wordline (WWL) gate contact, a write bitline (WBL) contact in connection with the first fin (115), and a storage node (SN) contact in connection with the first fin (115);
- a read transistor (120) having a storage node (SN) gate over the first fin (115), the storage node (SN) gate connected to a storage node (SN) gate contact, the storage node (SN) gate contact connected to the storage node (SN) contact, a read wordline (RWL) contact in connection with the first fin (115), and a read bitline (RBL) contact in connection with the first fin (115); and
- a dummy gate (130) extending to be in connection with the first fin (115), wherein the write wordline (WWL) gate, the storage node (SN) gate, and the dummy gate (130) are arranged to be in parallel to each other.

\* \* \* \* \*